(12) United States Patent
Hoffmann et al.

(10) Patent No.: US 7,973,345 B2
(45) Date of Patent: Jul. 5, 2011

(54) METHOD OF CLEANING A PATTERNING DEVICE, METHOD OF DEPOSITING A LAYER SYSTEM ON A SUBSTRATE, SYSTEM FOR CLEANING A PATTERNING DEVICE, AND COATING SYSTEM FOR DEPOSITING A LAYER SYSTEM ON A SUBSTRATE

(75) Inventors: Uwe Hoffmann, Alzenau (DE); Jose Manuel Dieguez-Campo, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 323 days.

(21) Appl. No.: 12/109,067

(22) Filed: Apr. 24, 2008

(65) Prior Publication Data

US 2009/0317927 A1 Dec. 24, 2009

Related U.S. Application Data

(60) Provisional application No. 60/941,189, filed on May 31, 2007.

(30) Foreign Application Priority Data

May 31, 2007 (EP) .................................. 07109357

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ... 257/288; 438/347; 438/359; 257/E21.17; 257/E21.077; 257/E21.218; 257/E21.32; 257/E21.227; 257/E21.229

(58) Field of Classification Search .................. 257/347, 257/246, 249, 288, 352, 359, E21.17, E21.077, 257/E21.218, E21.32, E21.227
See application file for complete search history.

(56) References Cited

U.S. PATENT DOCUMENTS
6,388,377 B1 * 5/2002 Kobayashi et al. ........... 313/505
(Continued)

FOREIGN PATENT DOCUMENTS
CN 1534806 A 10/2004
(Continued)

OTHER PUBLICATIONS

S.W. Kin, Ed., "Next Generation Mass Production Line and its OLED Module," *SID Symposium Digest of Technical Papers*, May 2003, vol. 34, issue 1, pp. 1414-1417, Society for Information Display, US.
(Continued)

*Primary Examiner* — David Nhu
(74) *Attorney, Agent, or Firm* — Kilpatrick Townsend & Stockton LLP

(57) ABSTRACT

A method of cleaning a patterning device, the patterning device having at least organic coating material (OLED material) deposited thereon, where the method includes the step of providing a cleaning plasma for removing the coating material from the patterning device by means of a plasma etching process. During the step of removing the coating material from the patterning device, the temperature of the patterning device does not exceed a critical temperature causing damage to the patterning device, while maintaining a plasma etching rate of at least 0.2 μm/min. In order to generate a pulsed cleaning plasma, pulsed energy is provided. The method can be carried out in a direct plasma etching process or in a remote plasma etching process. Different etching processes may be combined or carried out subsequently.

4 Claims, 1 Drawing Sheet

U.S. PATENT DOCUMENTS

| | | | |
|---|---|---|---|
| 6,872,322 B1 * | 3/2005 | Chow et al. | 216/67 |
| 6,911,667 B2 * | 6/2005 | Pichler et al. | 257/40 |
| 7,015,154 B2 | 3/2006 | Yamazaki et al. | |
| 7,307,382 B2 * | 12/2007 | Uhlig et al. | 313/506 |
| 7,485,580 B2 * | 2/2009 | Johnson et al. | 438/710 |

FOREIGN PATENT DOCUMENTS

| | | |
|---|---|---|
| CN | 1549351 | 11/2004 |
| DE | 3923188 C2 | 7/1992 |
| DE | 19643865 A1 | 5/1998 |
| EP | 1319732 A1 | 6/2003 |
| EP | 1715078 A1 | 10/2006 |
| EP | 1998389 A1 | 5/2007 |
| JP | 2000282219 A | 10/2000 |
| JP | 2001203079 A | 7/2001 |
| JP | 2003332052 A | 11/2003 |
| JP | 2004103512 A | 4/2004 |
| JP | 2005129299 A | 5/2005 |
| JP | 2007007644 A | 12/2007 |
| KR | 20030032415 A | 4/2003 |
| KR | 10-20070032925 | 3/2007 |
| TW | 589751 | 6/2004 |
| TW | 589920 | 6/2004 |
| WO | WO 0016914 A1 | 3/2000 |
| WO | WO 03043067 | 5/2003 |
| WO | WO 2007038427 A2 | 4/2007 |

OTHER PUBLICATIONS

X. Tang, et al., "Process-induced Damage by a Low Energy Neutral Beam Source [etching/cleaning]," *1999 4th international Symposium on Plasma Process-Induced Damage*, May 9-11, 1999, pp. 116-119, American Vacuum Society, CA, US.

* cited by examiner

METHOD OF CLEANING A PATTERNING DEVICE, METHOD OF DEPOSITING A LAYER SYSTEM ON A SUBSTRATE, SYSTEM FOR CLEANING A PATTERNING DEVICE, AND COATING SYSTEM FOR DEPOSITING A LAYER SYSTEM ON A SUBSTRATE

CROSS-REFERENCES TO RELATED APPLICATIONS

This application is a nonprovisional of, and claims the benefit of the filing date of U.S. Provisional Patent Application No. 60/941,189, entitled "METHOD OF CLEANING A PATTERNING DEVICE, METHOD OF DEPOSITING A LAYER SYSTEM ON A SUBSTRATE, SYSTEM FOR CLEANING A PATTERNING DEVICE, AND COATING SYSTEM FOR DEPOSITING A LAYER SYSTEM ON A SUBSTRATE," filed May 31, 2007, the entire disclosure of which is incorporated herein by reference for all purposes.

This application also claims the benefit of the filing date of European Patent Application No. EP 07109357.9, entitled "METHOD OF CLEANING A PATTERNING DEVICE, METHOD OF DEPOSITING A LAYER SYSTEM ON A SUBSTRATE, SYSTEM FOR CLEANING A PATTERNING DEVICE, AND COATING SYSTEM FOR DEPOSITING A LAYER SYSTEM ON A SUBSTRATE," filed May 31, 2007, the entire disclosure of which is incorporated herein by reference for all purposes.

BACKGROUND OF THE INVENTION

The invention relates to a method of cleaning a patterning device/mask having at least organic coating material deposited thereon, a method of depositing a layer system on a substrate, preferably a layer system including at least one layer comprising an organic light emitting diode material (OLED material), a system for cleaning a patterning device having at least an organic coating material (e.g. OLED material) deposited thereon, and a coating system for depositing a layer system on a substrate, preferably a layer system including at least one layer comprising an organic light emitting semiconductor material (OLED material).

In many technical applications, the deposition of a layer or a multi-layer system on a substrate is required. For instance, in the production of so-called OLED (organic light emitting diode) displays or screens, the respective layer systems have at least one light emitting layer comprising an organic, electroluminescent material (OLED material) which is deposited on a transparent substrate, such as glass. A typical example of a light emitting organic material is $Alq_3$.

The OLED layer may have a microstructure, e.g., for providing pixels which may be activated by corresponding electrode layers to emit light. The microstructures are generated by means of a patterning device, for example, a shadow mask, having a structure corresponding/complementary to the microstructure of the OLED layer.

The micro-structured OLED material is usually deposited on the substrate using a vacuum coating process. The shadow mask is placed on the substrate between the substrate surface and a material source supplying the organic coating material to be deposited on the substrate surface.

During the coating process, it can not be avoided that coating particles are also unintentionally deposited on the mask. Therefore, the mask having a microstructure with small dimensions is polluted and thus has to be removed and cleaned after one or more coating cycles. According to the state of the art, the OLED masks are therefore removed from the vacuum coating chamber after a predetermined utilization period. Afterwards, a wet chemical cleaning process is carried out under atmospheric pressure. Therefore, when using wet chemical cleaning processes, the OLED coating process has to be interrupted in an in-line arrangement of coating chambers for removing the mask from the respective vacuum coating chamber.

Furthermore, experiments have been performed to use linear ion sources of oxygen/argon ($O_2$/Ar) mixtures for cleaning masks. However, the cycle times for cleaning a mask were too long for using the process in commercial applications. Besides, a considerable increase in the temperature of the metal mask took place causing high temperature load, temperature stress and damage to the mask.

BRIEF SUMMARY OF THE INVENTION

It is an object of the present invention to provide a cleaning method, an OLED coating method, a cleaning system, and an OLED coating system that facilitate a continuous operation of an inline OLED coating device.

This object is achieved by providing a method of cleaning a patterning device, a method of depositing a layer system on a substrate, a system for cleaning a patterning device/mask and a coating system for deposition a layer system on a substrate. The method and features of the systems are described in detail herein.

The method of cleaning a patterning device according to the present invention is provided for cleaning a patterning device having at least a layer including organic coating material (OLED material) deposited thereon. The method comprises the step of providing a cleaning plasma for removing the coating material from the patterning device by means of a plasma etching process.

The inventors have found out that when cleaning the masks in a vacuum atmosphere, a continuous coating process in an in-line OLED coating device may be facilitated. It can be avoided that coating chambers, treatment chambers or transfer chambers of the OLED coating arrangement must be vented. Because the plasma etching process is carried out in a vacuum atmosphere, the masks may be cleaned in the coating chamber itself, or preferably in another vacuum chamber provided for cleaning and coupled to the coating system.

In one embodiment of the invention, during the step of removing the coating material from the patterning device, the temperature of the patterning device does not exceed 120° C.

Since usually the patterning device is a mask made of metal material or at least comprising a metal material, damages to the mask can not be avoided when a particular temperature is exceeded (at least during a particular period of time). Of course, the maximum temperature depends on the material, the kind of etching process used, etc. The maximum temperatures may be 120° C., 110° C., 100° C., 90° C., 80° C., or even lower.

Preferably, during the step of removing the coating material from the patterning device, the temperature of the patterning device does not exceed a critical temperature causing damage to the patterning device.

During the step of removing the coating material from the patterning device, a plasma etching rate of at least 0.2 µm/min, or 0.5 µm/min, 1 µm/min, 2.5 µm/min, 5 µm/min is maintained.

This means that the period required for etching the organic coating material off the mask/patterning device is quite short. For example, the mask can be cleaned after a coating cycle while the processed substrate is transported into the next vacuum chamber of the in-line OLED coating arrangement. Because of the high etching rate, only one mask set is required.

The etching rate must be high enough to provide a cycle time which is comparable with the cycle time of the in-line OLED coating device. For example, a cycle time of 1 minute could be sufficient to ensure an uninterrupted continuous operation of the in-line coating arrangement. On the other hand, of course, the mask may not be etched.

Consequently, the requirements for cleaning the system are a low temperature of the mask during the etching process, and no etching of the mask, while the etching rate is high enough to ensure a continuous in-line OLED coating process.

In a particular embodiment of the invention, the plasma used for removing the coating material from the patterning device is generated by activating an activation gas for generating the plasma in an activation zone. The patterning device is placed outside the activation zone during the process of removing the coating material from the patterning device. In this embodiment, a remote plasma is used for the etching process.

Basically, a plasma may be generated in direct contact with the substrate for treatment of the substrate. Accordingly, the reactive gas is activated by an activation gas adjacent to the substrate surface. However, in accordance with the present invention, the activation of the reactive gas, i.e., the generation of the reactive molecules may also take place remote from the substrate surface. This plasma is called a remote plasma, a downstream plasma or an afterglow plasma.

A reduction of the temperature load at high etching rates could be obtained by separating the zone for activating the reactive etching particles from the etching zone near the substrate surface. In the "remote" activation zone, reactive particles are generated/activated outside the etching area and transported into the etching area by a strong gas stream. Another advantage of the "remote" plasma etching processes is that the process is carried out at an operation pressure where the life time of ions is short enough so that the ions decay before impinging the mask.

As an example, in a remote plasma CVD process, an activation gas passes a discharge zone for generating activated atoms/molecules, i.e., $O_2$, $H_2$, $N_2O$. In an afterglow zone located downstream the activation zone, the activation gas is mixed with the etching gas or a mixture of a plurality of etching gases remote from the activation zone and near the substrate surface. The etching gas may also pass an activation zone separated from the activation zone of the activation gas.

In the mixing zone, the activation gas and the etching gas interact. Excitation energy is transferred from the molecules/atoms of the activation gas to molecules/atoms of the etching gas for generating a homogeneous pre-reaction. In a further reaction, the etching molecules/atoms react with the mask and remove organic coating particles from the mask.

By using the remote plasma etching process, an effective plasma etching process having high etching rates can be provided without exposing the mask to high temperatures during the process. Furthermore, the mask is not damaged by the molecules/atoms of the activation gas having a high energy. The temperature of the substrate, i.e., the mask is considerably increased by the impingement of high energy ions of the activation gas (mixture) on the mask surface. It has been recognized by the inventors that the ion bombardment could be reduced in order to decrease the temperature load exposed to the mask while maintaining high etching rates when using a remote plasma source.

In addition, when using a remote plasma source, the mask is not exposed to the RF or microwave excitation radiation for the activation gas molecules/atoms, because the activation zone is remote from the surface of the mask. The mask is placed outside the plasma activation zone.

The inventive method includes using one or more etching processes, either in combination or sequentially. Particularly, the method includes providing pulsed energy in order to generate a pulsed cleaning plasma during the step of removing the coating material from the patterning device/mask. In a further embodiment of the invention, the plasma source is a pulsed plasma source.

This embodiment includes providing the pulsed energy in a plasma generation zone adjacent to the mask surface in a direct plasma etching process, or providing pulsed energy in a zone remote from the mask surface in a remote plasma etching process. By providing pulsed energy, the power supplied to the mask may be controlled by the frequency and the power level of the supplied energy. Therefore, the increase in the temperature of the mask may be controlled effectively.

In fact, when using pulsed plasma etching processes, the pulse length, the frequency and the power may be set and optimized to reduce the thermal stress of the substrate, i.e., the mask, while maintaining the etching rate sufficiently high. The reactive particles are generated during an energy pulse (e.g., microwave or RF radiation). The energy pulse initiates a chemical process that continues until the reactive particles are used up, even in periods between two pulses of the energy supply.

In another embodiment of the invention, the cleaning plasma is generated by introducing RF and/or HF and/or microwave radiation into a plasma activation zone. As described above, the plasma activation zone may be located near the mask (direct plasma etching process) or remote from the mask (remote plasma etching process). The radiation is coupled to the activation gas and/or to the reactive gas mixture in a suitable application rate.

The process of removing the coating material from the patterning device is carried out in a cleaning chamber, the cleaning chamber having an inside pressure of less than 10 mbar, or 5 mbar, 1 mbar, 0.1 mbar. It is important that the mask cleaning process is performed in a vacuum in order to ensure a continuous in-line OLED coating process. The cleaning process may be performed within a coating or treatment chamber.

Alternatively, the method is carried out in a cleaning chamber which is separated from an OLED coating chamber. The cleaning chamber may be coupled to the OLED coating chamber. When transporting the mask from the OLED coating chamber into the cleaning chamber, it is not required to change the pressure in any of the chambers significantly. Furthermore, it is not necessary to provide lock and/or unlock chambers for removing the mask from the coating system before cleaning and bringing it back into the system after cleaning.

The cleaning plasma may be a plasma generated from a mixture of at least oxygen ($O_2$) and halide containing molecules. For example, good results have been obtained using a plasma containing $CHF_3/O_2$, or $SF_6/O_2$.

An inventive method of depositing a layer system on a substrate, preferably a layer system including at least one layer comprising an organic light emitting semiconductor material (OLED material), comprises the steps of: (1) arranging the substrate in a coating chamber, the coating chamber having a source for providing coating material to be deposited on the substrate; (2) providing a patterning device between the substrate and the source; (3) depositing a layer comprising an organic light emitting semiconductor material on the substrate; (4) removing the patterning device from the coating chamber and arranging the patterning device in a cleaning chamber; and (5) carrying out a method of cleaning as described above in order to remove coating material from the patterning device.

When carrying out the method, the substrate may already have one or more layers deposited thereon. Furthermore, the mask may be used for one or more OLED coating cycles before being cleaned. OLED coating processes may include all kinds of coating methods, particularly PVD (physical vapor deposition), CVD (chemical vapor deposition), PECVD (plasma enhanced chemical vapor deposition), vaporization processes, sputtering, etc. Particularly, the steps of arranging the substrate in the coating chamber, and depositing a layer comprising an organic light emitting semiconductor material on the substrate may be repeated n times with n=0, 1, 2, 3, . . . before removing the patterning device from the coating chamber and carrying out the plasma cleaning process. This means that the mask is cleaned after every run or after n runs.

The patterning device is provided between the substrate and the material source for the coating material, and is arranged within the coating chamber. The patterning device and/or the substrate may be aligned relative to each other and/or to the coating material source before the coating process is started.

An inventive system for cleaning a patterning device having at least a layer including an organic coating material (OLED material) deposited thereon, comprises a plasma source for providing a cleaning plasma for removing the coating material from the patterning device by means of a plasma etching process.

Preferably, the system comprises means for maintaining a temperature of the patterning device of less than 120° C., 100°, or 80° C. In the process, a plasma etching rate of at least 0.2 µm/min, or 0.5 µm/min, 1 µm/min, 2.5 µm/min, 5 µm/min, is maintained.

Furthermore, the system comprises means for maintaining a temperature of the patterning device of less than a critical temperature causing damage to the patterning device. Especially, a melting temperature of the patterning device may not be exceeded for a significant time period during the process of removing organic molecules from the mask.

The plasma source may be a remote plasma source that activates an activation gas in an activation zone, and the patterning device is placed outside the plasma activation zone during the etching process. The activation gas may be a noble gas, $O_2$, $H_2$, $N_2O$, etc. The activation gas molecules/atoms are excited in the activation zone, followed by transportation into a mixing and plasma generation zone. In this zone, the activation gas molecules/atoms are mixed with the etching gas. The atoms/molecules of the etching gas are excited by the activation atoms/molecules. The activation gas molecules/atoms and the activated atoms/molecules of the etching gas constitute the etching plasma. The mixing and plasma generation zone is located adjacent to the surface of the mask for the treatment of the mask surface. In this embodiment, the activation zone is remote from the patterning device during the cleaning process such that the distance between the activation zone and the patterning device is sufficiently large to prevent ions generated in the activation zone to impinge the patterning device during the lifetime of the activated ions, i.e., the operating pressure of the cleaning system is so low that the activated ions do not reach the surface of the patterning device.

An inventive coating system for depositing a layer system on a substrate, preferably a layer system including at least one layer comprising an organic light emitting semiconductor material (OLED material), comprises: (1) at least a coating chamber for depositing a coating layer on a substrate; (2) at least one patterning device for selectively and/or locally blocking coating particles from being deposited on particular surface areas of the substrate in order to form a structured layer comprising at least the organic light emitting semiconductor material; and (3) a system for cleaning the patterning device as described above.

Preferably, the system for cleaning the patterning device comprises a (vacuum) cleaning chamber configured as a chamber separated from the (vacuum) coating chamber. The pressure level of the cleaning chamber may be the same or similar to the pressure level of the coating chamber. Thus, no time has to be spent on compensating a pressure difference. Alternatively, the system for cleaning may be provided in the (vacuum) coating chamber. In another embodiment of the invention, the coating system is an in-line OLED coating system.

BRIEF DESCRIPTION OF THE DRAWINGS

Further objects and advantages result from the following description of specific embodiments relating to the FIGURE.

DETAILED DESCRIPTION OF THE INVENTION

Figure 1:
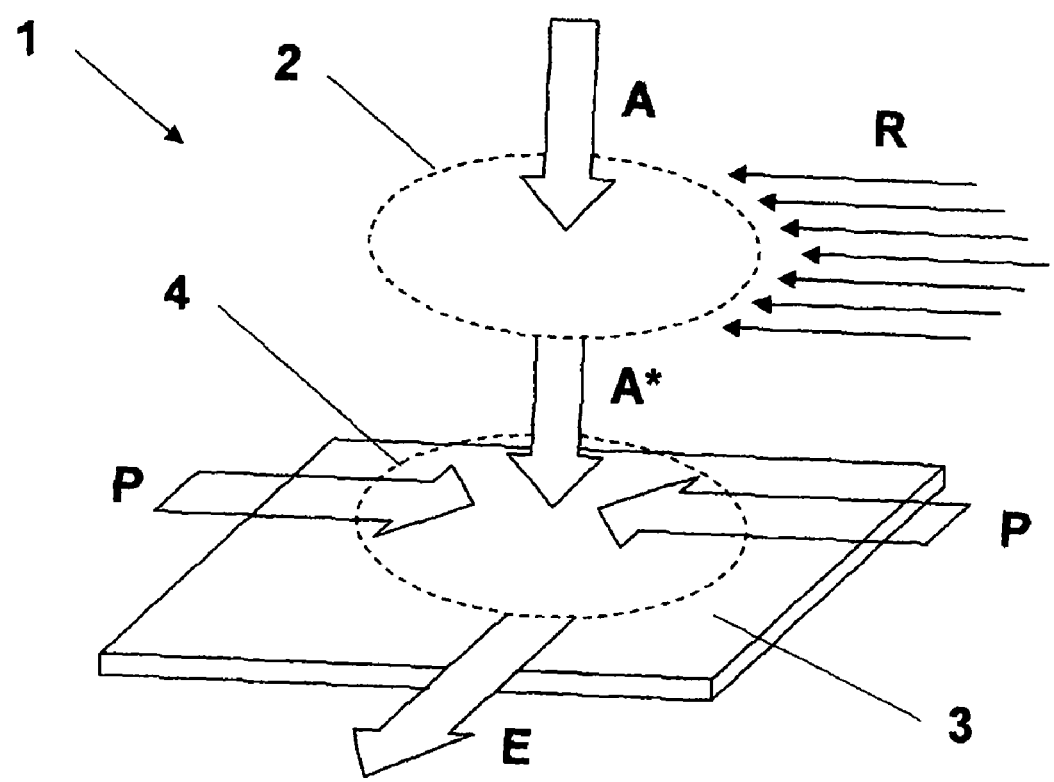
FIG. 1 shows a schematic view of a mask cleaning system according to the present invention.

FIG. 1 illustrates a mask/patterning device cleaning system 1 according to the present invention. In this embodiment, the mask cleaning system 1 comprises a remote plasma source. The activation gas or gas mixture illustrated by an arrow A is transported into an activation zone 2, which is located remotely from the surface of a metal mask 3. There are organic particles deposited on the surface of the mask 3 that have to be removed in a plasma etching process. The atoms/molecules of the activation gas A are activated in the activation zone 2 by a pulsed RF or microwave radiation R provided by a pulsed RF or microwave radiation source (not shown).

After being activated, the activation gas atoms/molecules indicated by an arrow A*, enter into a mixing and excitation zone 4 which is located near and adjacent to the surface of the mask 3. In this zone 4, the activated atoms/molecules A* are mixed with process gas molecules/atoms (etching molecules/atoms) indicated by arrows P. The activated molecules/atoms A* excite the process gas atoms/molecules P within the zone 4 such that an etching plasma is generated in this zone 4. The etching plasma is in contact with the surface of the mask 3 and thus cleans the mask 3 at a considerable rate. The used gas mixture is removed from the surface of the mask 3 as indicated by the arrow E.

Due to the fact that a) the plasma is a pulsed plasma, and b) the activation of the activation gas A is carried out in a zone 2 remote from the surface of the mask 3, the temperature of the metal mask 3 is maintained low enough to prevent a temperature damage of the mask 3 and to prevent etching of the mask.

Further parameters of the invention will be disclosed in the following examples.

Example 1

In a cleaning system according to the present invention, a shadow mask which is coated with organic material, e.g., $Alq_3$ molecules, is placed in a predetermined distance relative to a plasma zone generated in a vacuum chamber.

The system comprises a plasma generating source in order to generate and maintain an etching plasma for cleaning the mask. In this example, the plasma generating gas mixture comprises a mixture of $SF_6/O_2$ at a rate of 200 sccm to 400 sccm (set by mass flow rate controllers).

The plasma generating source comprises a microwave source providing 2.45 GHz microwave radiation to dissociate a gas/gas mixture for generating the plasma. The power is supplied by 6 kW power pulses with a frequency of 666 Hz. The total pressure in the vacuum cleaning chamber is 0.1 mbar. $Alq_3$ molecules are removed from the mask with an etching rate of 0.24 μm/min. The mask temperature is kept below 100° C. with an increase of the mask temperature of just a few degrees (° C.) from the plasma cleaning/etching, and no etching of the metal mask occurs.

The etching/cleaning process may be carried out using a direct plasma or a remote plasma. Further etching processes may be combined with the etching process or carried out subsequently.

Example 2

Instead of using a mixture of $SF_6/O_2$ as shown in Example 1, results were obtained by using a plasma generation gas mixture of $CHF_3/O_2$. A plasma etching rates up to 0.5 μm/min for cleaning the mask and a cycle time of less than 1 min were obtained without a considerable increase in the mask temperature. Consequently, a continuous operation of an OLED in-line coating arrangement could be accomplished.

Thus, having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A system for cleaning a patterning device, the patterning device having at least an organic coating material comprising an organic light emitting diode material (OLED material) deposited thereon, the system comprising:
   a plasma source in a plasma etching process for providing a cleaning plasma for removing the organic coating material from the patterning device; and
   a device for maintaining a temperature of the patterning device of less than a critical temperature causing damage to the patterning device,
   wherein said plasma source comprises a remote plasma source that activates at least an activation gas in an activation zone, and said patterning device is placed outside said activation zone during said plasma etching process.

2. The system according to claim 1, wherein the temperature of the patterning device is less than 120° C.

3. The system according to claim 1, wherein the plasma source is a pulsed plasma source.

4. A system for cleaning a patterning device, the patterning device having at least an organic coating material comprising an organic light emitting diode material (OLED material) deposited thereon, the system comprising:
   a plasma source in a plasma etching process for providing a cleaning plasma for removing the organic coating material from the patterning device,
   wherein a temperature of the patterning device is maintained at a temperature of less than a critical temperature causing damage to the patterning device, and
   wherein said plasma source comprises a remote plasma source that activates at least an activation gas in an activation zone, and said patterning device is placed outside said activation zone during said plasma etching process.

* * * * *